United States Patent [19]
Mizutani et al.

[11] Patent Number: 5,777,275
[45] Date of Patent: Jul. 7, 1998

[54] BENDABLE CIRCUIT BOARD HAVING IMPROVED RESISTANCE TO BENDING STRAIN AND INCREASED ELEMENT MOUNTING AREA

[75] Inventors: Yoshitaka Mizutani, Hyogo; Tetsuro Washida, Tokyo, both of Japan

[73] Assignee: Mitsubishi Denki Kabushiki Kaisha, Tokyo, Japan

[21] Appl. No.: 648,953

[22] Filed: May 16, 1996

[30] Foreign Application Priority Data

Sep. 25, 1995 [JP] Japan ................... 7-245877

[51] Int. Cl.⁶ ............................................ H05K 1/00
[52] U.S. Cl. ................................. 174/254; 361/749
[58] Field of Search ......................... 174/254, 255, 174/250; 361/749; 439/67, 77; 396/542

[56] References Cited

U.S. PATENT DOCUMENTS

| | | | |
|---|---|---|---|
| 4,335,272 | 6/1982 | Pittenger | 174/254 |
| 5,224,023 | 6/1993 | Smith et al. | 361/412 |
| 5,495,076 | 2/1996 | Davis | 174/254 |

FOREIGN PATENT DOCUMENTS

| | | | |
|---|---|---|---|
| 4-263495 | 9/1992 | Japan | 361/749 |
| 4332696 | 11/1992 | Japan. | |
| 4355192 | 12/1992 | Japan. | |

*Primary Examiner*—Kristine L. Kincaid
*Assistant Examiner*—Kristina Soderquist
*Attorney, Agent, or Firm*—Leydig, Voit & Mayer, Ltd.

[57] ABSTRACT

A printed circuit board includes first and second flat portions each including first and second sides for mounting a electrical elements. A bending portion joins the flat portions and bends to place the flat portions in a superposed state. A cutout having an elongate portion and an end portion is located in the bending portion. The end portion is substantially equal in width to the bending portion. The elongate portion is narrower than the bending portion. The elongate portion creates additional flat portions for mounting elements when the first and second flat portions are in the superposed state. The end portion is resistant to bending strain. The end portion may be circular, semi-circular, or another shape.

17 Claims, 7 Drawing Sheets

BENDABLE CIRCUIT BOARD HAVING IMPROVED RESISTANCE TO BENDING STRAIN AND INCREASED ELEMENT MOUNTING AREA

BACKGROUND OF THE INVENTION

The present invention relates to a printed circuit board used, for example,in a memory card.

Figure 12:
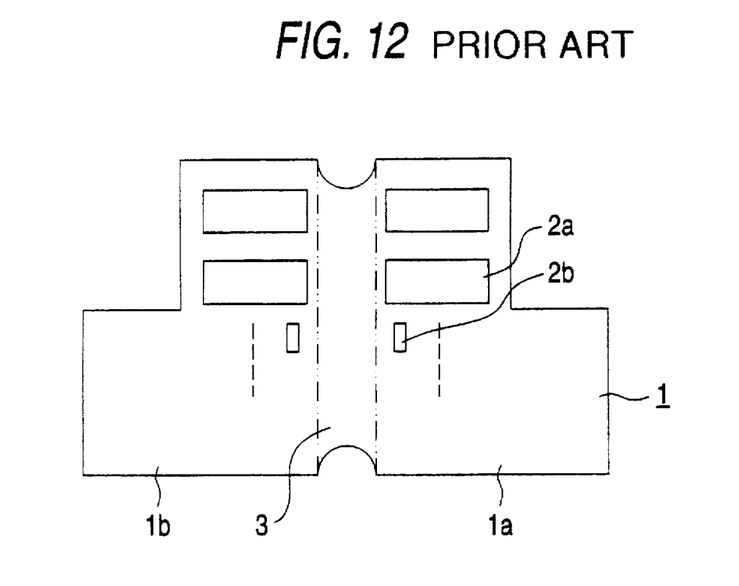
FIG. 12 is a plan view showing a conventional printed circuit board contained in a memory card.
Figure 13:
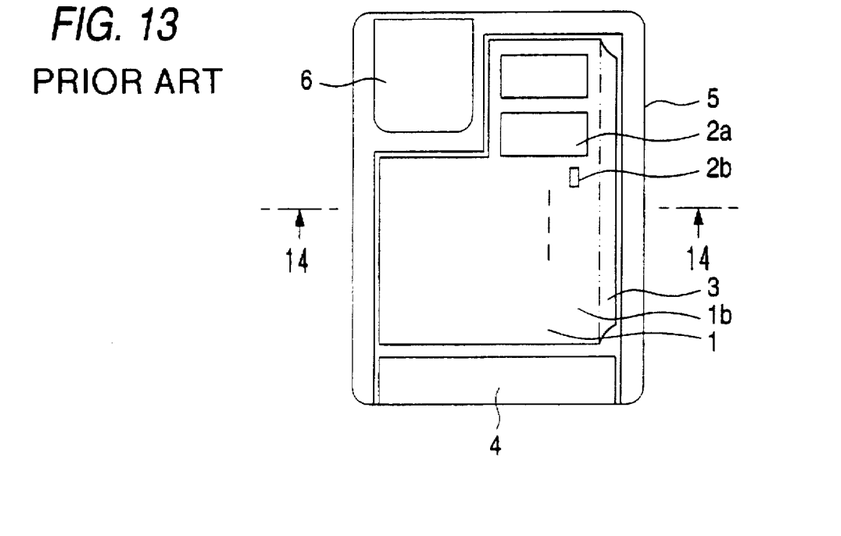
FIG. 13 is a plan view showing the inner element of a conventional memory card.
Figure 14:
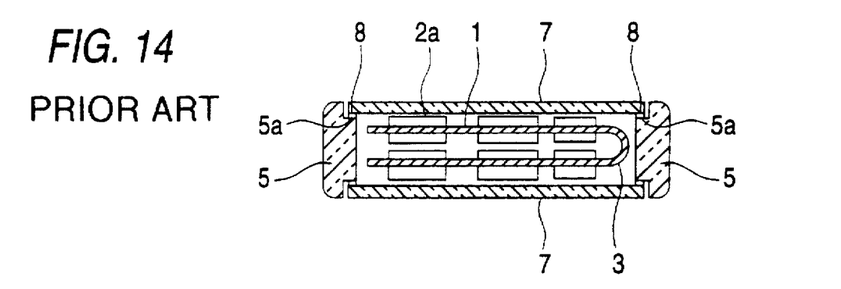
FIG. 14 is a cross sectional view taken on line 14—14 of FIG. 13.
Figure 15:
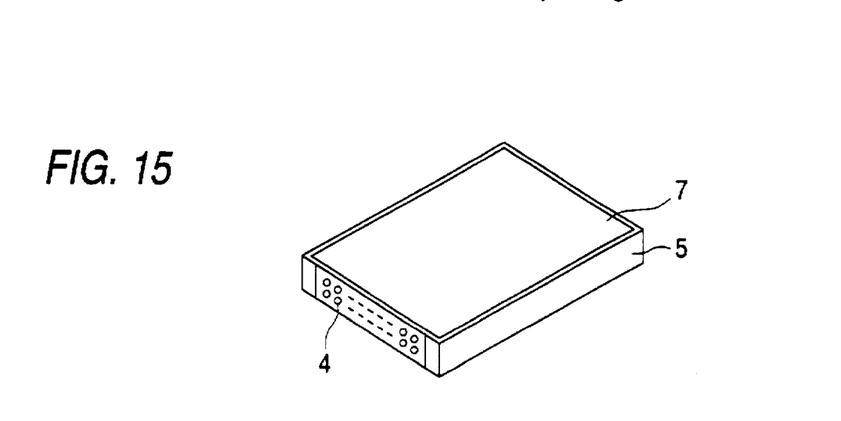
FIG. 15 is a perspective view showing a memory card.

A conventional printed circuit board used as a memory card, for example, is disclosed in Published Unexamined Japanese Patent Application No. Hei. 4-332696. In the printed circuit board disclosed in Hei. 4-332696, electronic elements are mounted on both sides of one printed circuit board. The printed circuit board with the elements mounted thereon is bent along the center line of the board, thereby increasing the density of the mounted elements. FIG. 12 is a plan view showing a conventional printed circuit board contained in a memory card that is developed into a plane. The printed circuit board 1 includes flat portions 1a and 1b that allow the elements to be mounted thereon, and a bending portion 3 located between the flat portions 1a and 1b. FIG. 13 is a plan view showing the inner elements of a conventional memory card. The printed circuit board 1 with the elements mounted thereon is bent along the bending portion 3 so that the flat portions 1aand 1b, of the board are laid together into a compact form. The resultant compact board is placed in a card case 5. Reference numeral 4 designates a connector 4 used for transferring information to and from a related system. Numeral 6 designates a battery holder. FIG. 14 is a cross sectional view taken on line 14—14 of FIG.13 and reference numeral 5a designates an adhesive used for bonding upper and lower name plates 7 to the card case 5. FIG. 15 is a perspective view showing a memory card. To increase the memory capacity of the memory card, the ICs 2 and the a chip element 2b are mounted on the flat portions of both sides of the printed circuit board 1.

Since the dimensions of the memory card are regulated by the related standard, each element is laid out on the printed circuit board 1 so that as many elements as possible are mounted on the printed circuit board 1.

In the printed circuit board 1 constructed as shown in FIG. 12, the bending portion 3 is inevitably curved. For reliable soldering and to avoid damage of the elements, the bending portion 3 is unavailable for mounting of ICs and chip elements thereon. Thus, to mount many elements on the printed circuit board 1, it is necessary to keep horizontal the board surface having the elements thereon, and to increase the area of the board surface which allows the elements to be mounted thereon, namely, the flat portions 1a and 1b. An increase of such the board surface area necessitates a reduction of the amount of the adhesive 5a which leads to a reduction of the adhesion strength.

SUMMARY OF THE INVENTION

Accordingly, the object of the present invention is to increase the area of the board surface of a printed circuit board which allows more elements, such as ICs and chip elements, to be mounted thereon.

According to the present invention, a printed circuit board includes a bent portion and flat portions on which elements are mounted characterized in that an elongated cutout is formed in the bending portion whereby the areas of the flat portions are increased.

The invention further provides a printed circuit board of the type in which elements are mounted on the flat portions

2 and the printed circuit board is bendable characterized in that an elongated cutout is formed in a bending portion to thereby flatten part of the bending portion hence increasing the area of the flat portions.

The invention additionally provides a printed circuit board having a bending portion and flat portions on which elements are mounted characterized in that an elongated cutout is formed in the bending portion and extending along the side of one of the elements facing the bending portion, whereby the areas of the flat portions are effectively increased.

In the printed circuit board, cutouts are formed at both ends of the bending portion.

Also in the printed circuit board, an enlarged cutout serving as a strain-transfer/cut-extension stopping means is formed at the top end of the elongated cutout.

Furthermore, the invention provides a printed circuit board having a bending portion and flat portions characterized in that a cutout is formed in a portion of the printed circuit board including the bending portion and a battery is placed in a space defined by the cutout when elements are mounted on the flat portions and, in this state, the printed circuit board is folded.

DETAILED DESCRIPTION OF THE PREFERRED EMBODIMENTS (Embodiment 1)

Figure 1:
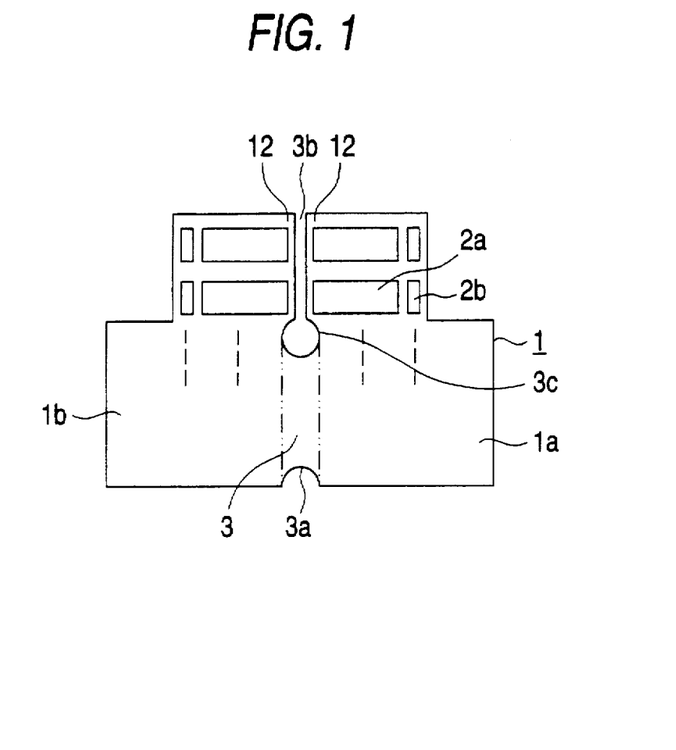
FIG. 1 is a plan view showing a printed circuit board according to the Embodiment 1 of the present invention.
Figure 2:
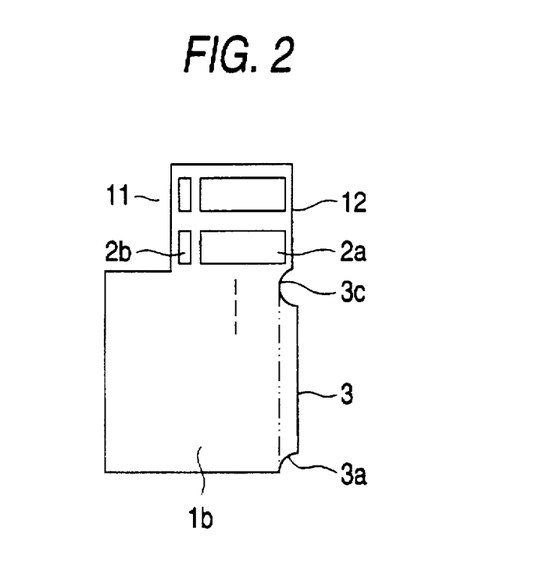
FIG. 2 is a plan view showing the printed circuit board being bent.
Figure 3:
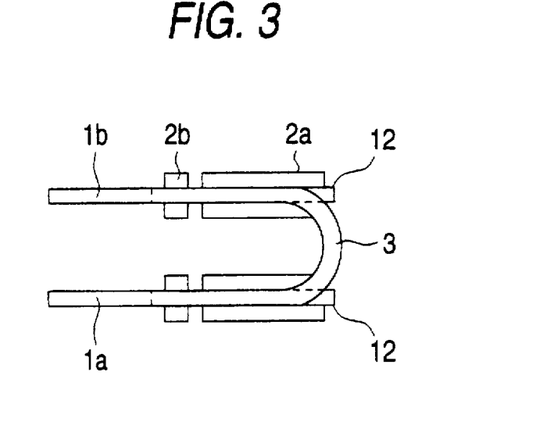
FIG. 3 is an enlarged side view showing the printed circuit board after being bent.

A printed circuit board according to the Embodiment 1 of the present invention will be described. FIGS. 1 to 3 show a printed circuit board according to the Embodiment 1 of the present invention. Of those figures, FIG. 1 is a plan view showing the printed circuit board in a planner state in which elements are mounted on only the upper half of the printed circuit board while the elements mounted on the lower half thereof are omitted for simplicity. FIG. 2 is a plan view showing the printed circuit board after being bent. The printed circuit board is bent along the bending portion 3 in order to put it into a card case.

A printed circuit board 1 on which elements, such as ICs 2a and chip elements 2b, are mounted, includes flat portions 1a and 1b that allow the elements to be mounted thereon, and a bending portion 3 located therebetween. The flat portions 1a and 1b are symmetrical with respect to the bending portion 3 and the wires for electrically connecting the flat portions 1a and 1b are located in the bending portion 3. The printed circuit board 1 is bent along the bending portion 3 so that the flat portions 1a and 1b having the elements 2a and 2b mounted thereon are laid together. In FIG. 2, reference numeral 11 designates a space in which a battery for the card case is placed.

Conductive layers such as thin metal films with a plurality of conductive patterns, lands (not shown), and conductive through-holes interconnecting the conductive layers are formed on and in the flat portions 1a and 1b of the printed circuit board 1. Insulating layers exist among the conductive layers and the lands on the flat portions 1a and 1b. These insulating layers insulate the areas thereof except the land surfaces while the connection elements interconnect the conductive layers. The insulating layers firmly hold the conductive layers so as to keep a preset mechanical strength of the flat portions 1a and 1b. A number of lands for soldering are formed on the surfaces of the flat portions 1a and 1band mounting elements, such as ICs 2a and chip elements 2b, i.e., functional elements, are mounted on the lands, and are connected by soldering. One or two conductive layers, serving as wires, interconnect specific conductive layers on the flat portions 1a and 1b, and insulating layers are included in the bending portion 3.

The flexural rigidity of the bending portion 3 is smaller than that of each of the flat portions 1a and 1bbecause when the bending portion 3 is bent, a large strain is prevented. A large bending strain could possibly damage the elements mounted on the flat portions 1a and 1b. The upper half portions of the flat portions 1a and 1b are separated by an elongated cutout 3b,which is narrower than the bending portion 3. A circular cutout 3c, the diameter of which is substantially equal to the width of the bending portion 3, is formed at the top end of the elongated cutout 3b. The center of the circular cutout 3c lies on the center line of the elongated cutout 3b. A semicircular cutout 3a, the diameter of which is substantially equal to that of the circular cutout 3c, is formed at the bottom end of the bending portion 3. The width of the bending portion 3 and the width of the elongated cutout 3b are approximately three times as long as and nearly equal to the radius of the bending portion 3 when bent for setting it into the card case, respectively.

The circular cutout 3c has at least the following two functions. 1) The circular cutout 3c prevents the cut of the elongated cutout 3b from extending to the bending portion 3. 2) The circular cutout 3c impedes the transfer of a bending strain in the bending portion 3 to the regions of the flat portions 1a and 1b adjacent to the cutout when the printed circuit board 1 is bent along the bending portion 3. Hence, the circular cutout 3c constitutes a strain-transfer/cut-extension stopping means.

Additionally, the provision of the elongated cutout 3b increases the areas of the element-mounting portions (flat portions) of the printed circuit board 1, by areas 12, each having a width nearly equal to the radius of the bending portion 3 when it is bent. In this case, the area of the printed circuit board 1, when it is set in the card case, is not increased. Thus, the printed circuit board 1 secures an increased freedom in mounting elements although the area of the printed circuit board 1 is equal to that of the conventional printed circuit board. Accordingly, the number of the elements that can be mounted on the printed circuit board is increased, and the element-mounting area of the printed circuit board is efficiently used.

(Embodiment 2)

Figure 4:
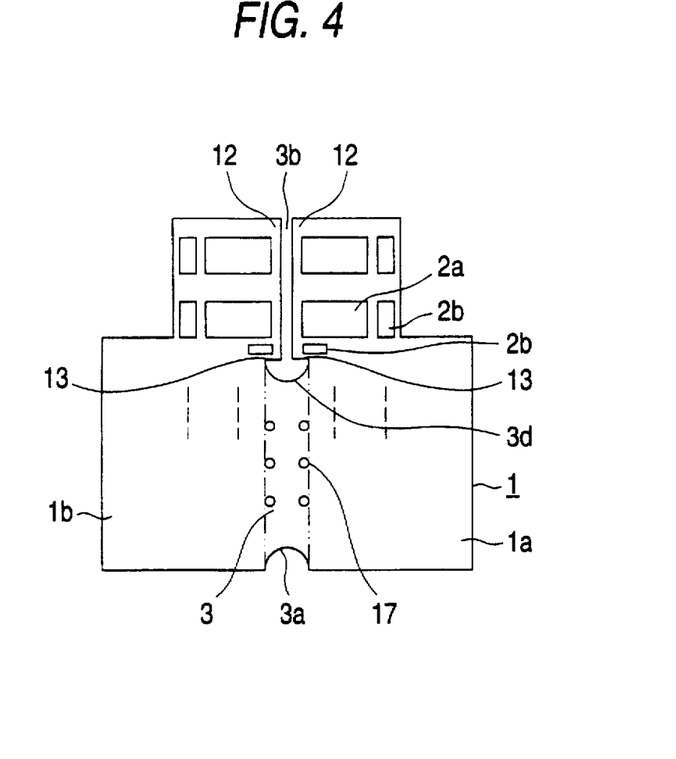
FIG. 4 is a plan view showing a printed circuit board according to the Embodiment 2 of the present invention.
Figure 5:
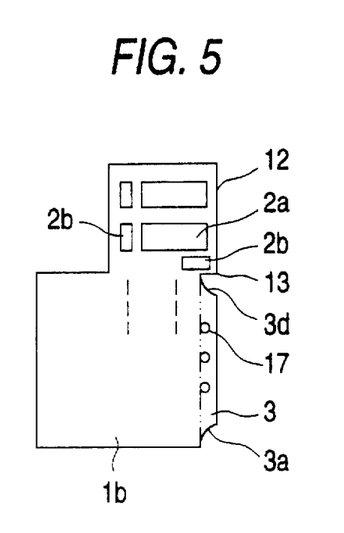
FIG. 5 is a plan view showing the printed circuit board after being bent.

FIGS. 4 and 5 show the Embodiment 2 of the present invention. Of these figures, FIG. 4 is a plan view showing a printed circuit board according to the Embodiment 2 of the present invention, the printed circuit board being illustrated in a planar state FIG. 5 is a plan view showing the printed circuit board after being bent. Throughout the drawings, including FIGS. 4 and 5, like reference numerals indicate like or equivalent portions.

In the Embodiment 1, the circular cutout 3c at the top end of the cutout is circular. In the Embodiment 2, it is a semicircular cutout 3d. It is noted that the areas of the element-mounting portions (flat portions) are increased by the half area of the circle. The increased areas of the element-mounting portions are designated by numeral 13. Elements 2b are mounted on the increased area 13. Two series of small holes 17 are formed on both sides of the bending portion 3, which are adjacent to the flat portions 1a and 1b of the printed circuit board. These series of holes make it easy to bend the flat portions 1a and 1b along both sides of the bending portion 3, the boundaries between one side of the bending portion 3 and the flat portion 1a, and the other side thereof and the flat portion 1b. Further, the series of holes impede the transfer of a bending strain to the flat portions 1a and 1b. The bending strain is caused along and in the both sides of the bending portion 3 when the printed circuit board is bent along the bending portion 3. Further, a sheet of good thermal conductor may be inserted between the flat portions 1a and 1b, which result from the folding of the printed circuit board 1 along the bending portion 3. Use of the sheet will drive heat locally generated by the individual elements in various directions.

(Embodiment 3)

Figure 6:
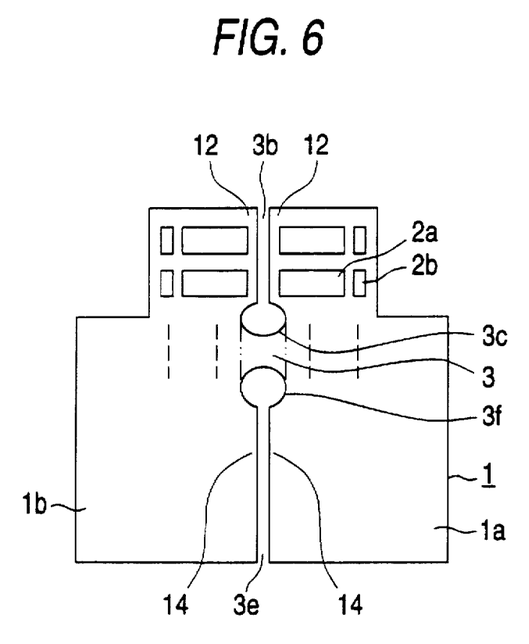
FIG. 6 is a plan view showing a printed circuit board according to the Embodiment 3 of the present invention.

FIG. 6 is a plan view showing a printed circuit board according to the Embodiment 3 of the present invention. In the figure, the printed circuit board is illustrated in a planar state. The upper portions of the flat portions 1a and 1b are separated by an elongated cutout 3b of which the width is smaller than the width of the bending portion 3. The lower portions of the flat portions 1a and 1b are parted by an elongated cutout 3e having a width smaller than the width of the bending portion 3. The bending portion 3, located between the upper and the lower portions of the printed circuit board 1, interconnects the flat portions 1a and 1b. A circular cutout 3f, the diameter of which is substantially equal to the width of the bending portion 3, is formed at the top end of the elongated cutout 3e. The center of the circular cutout 3f lies on the center line of the elongated cutouts 3e and 3b. The width of the bending portion 3 and the width of the elongated cutout 3e are approximately three times as long as and nearly equal to the radius of the bending portion 3 when bent for setting it into the card case, respectively. The elongated cutout 3e increases the area of the element-mounting portions (flat portions) of the printed circuit board 1 by area 14 extending along the elongated cutout 3e.

(Embodiment 4)

Figure 7:
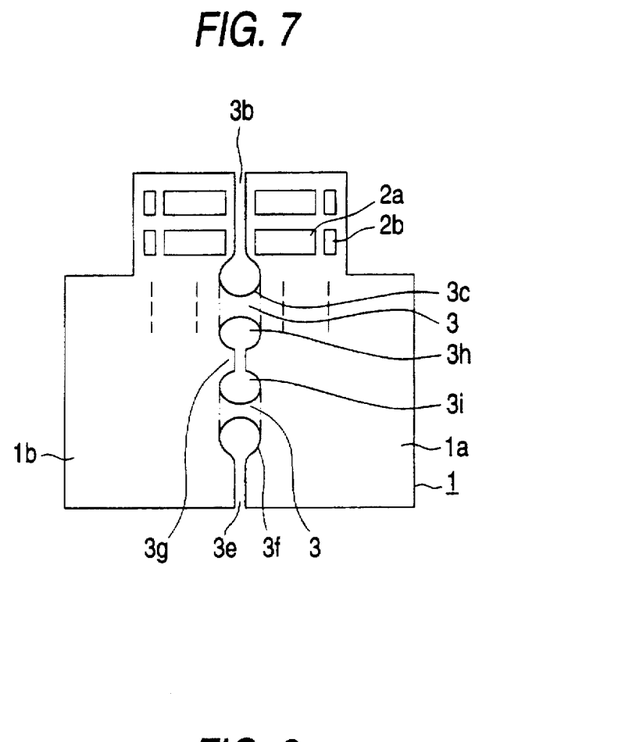
FIG. 7 is a plan view showing a printed circuit board according to the Embodiment 4 of the present invention.

FIG. 7 is a plan view showing a printed circuit board according to the Embodiment 4 of the present invention. In the printed circuit board of FIG. 7, an elongated cutout 3g is additionally formed in line with the elongated cutouts 3b and 3e and is located between the cutouts 3b and 3e. Circular cutouts 3h and 3i are formed at both ends of the elongated cutout 3g. The width of the elongated cutout 3g, and the diameters of each of the circular cutouts 3h and 3i are equal to those in the Embodiment 1. Those cutouts lie on the center line of the elongated cutouts 3e and 3b. Also in the Embodiment 4, the printed circuit board 1 secures an increased freedom in mounting elements since the areas of the element-mounting portions are increased by the area 14. As a result, the mechanical interconnections of the elements and the wiring are well harmonized. In the Embodiment 4, the length of the elongated cutout 3g is reduced. Accordingly, the wires connecting the elements mounted on the flat portions 1a and 1b are gathered together in the elongated cutout 3g. For this reason, it is preferable to use a multi-layer structure consisting of two or more layers or to use the wires in a time-division manner.

(Embodiment 5)

Figure 8:
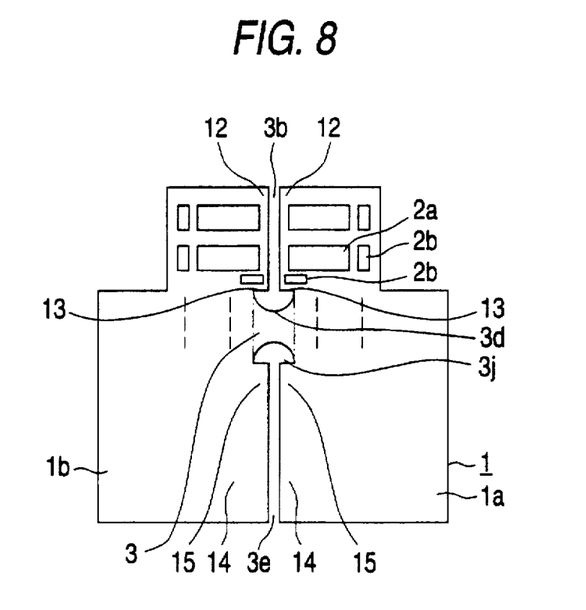
FIG. 8 is a plan view showing a printed circuit board according to the Embodiment 5 of the present invention.

FIG. 8 is a plan view showing a printed circuit board according to the Embodiment 5 of the present invention. The Embodiment 5 is a modification of the Embodiment 3. In the Embodiment 5, semicircular portions 3d and 3j acting as strain-transfer/cut-extension stopping means are substituted for the circular cutouts 3c and 3f shown in the Embodiment 3. Also in the Embodiment 5, the areas of the element-mounting portions (flat portions) are increased by areas 13, and 15.

(Embodiment 6)

Figure 9:
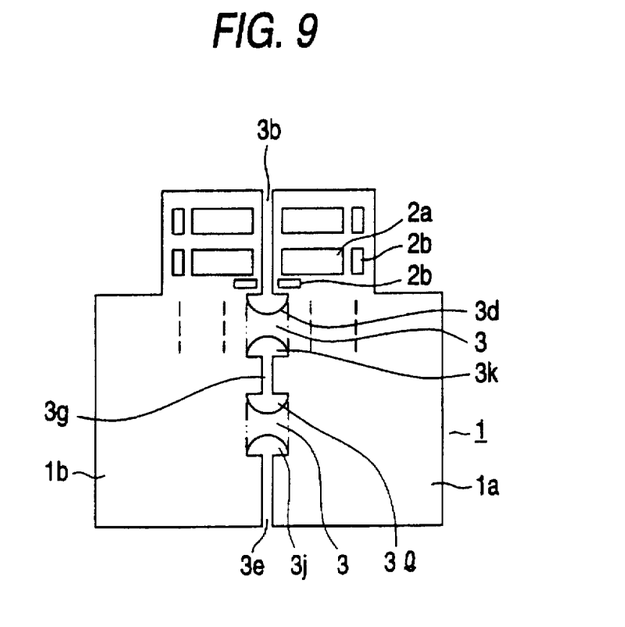
FIG. 9 is a plan view showing a printed circuit board according to the Embodiment 6 of the present invention.

FIG. 9 is a plan view showing a printed circuit board according to the Embodiment 6 of the present invention.

The Embodiment 6 is a modification of the Embodiment 4. In the Embodiment 6, semicircular portions 3c, 3f, 3h, and 3i acting as strain-transfer/cut-extension stopping means are substituted for the circular cutouts 3d, 3j, 3k, and 31. Also in the Embodiment 6, the areas of the element-mounting portions (flat portions) are increased. Greater freedom in mounting the elements is secured. Further, the mechanical interconnections of the elements and the wiring are well harmonized.

(Embodiment 7)

Figure 10:
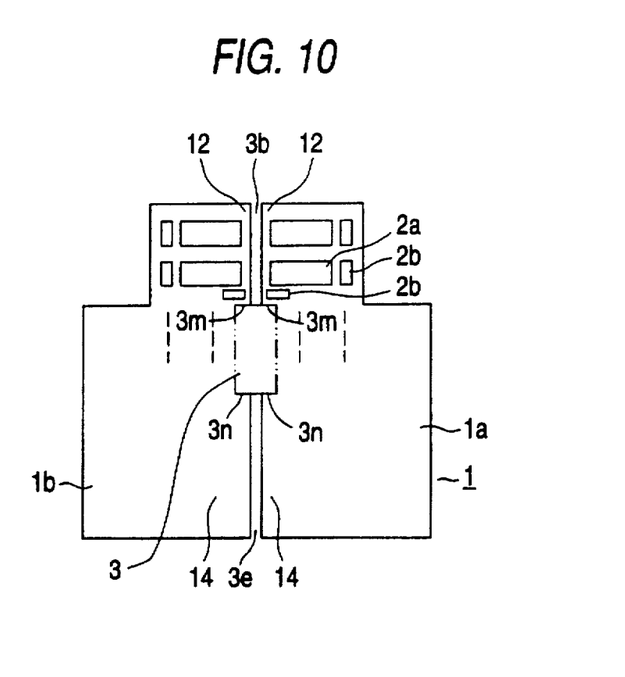
FIG. 10 is a plan view showing a printed circuit board according to the Embodiment 7 of the present invention.

FIG. 10 is a plan view showing a printed circuit board according to the Embodiment 7 of the present invention.

The Embodiment 7 is a modification of the Embodiment 3. In the Embodiment 7, slits 3m and 3n are substituted for the circular cutouts 3c and 3f at the top ends of the elongated cutouts 3b and 3e.

If there is no danger that a stress that is generated in the printed circuit board when it is bent is concentrated and might break the printed circuit board 1, then the slits 3m and 3n are preferably used in place of the circular portions 3c and 3f. The slits 3m and 3n reduce the area of the bending portion 3 on which the electrical connection wires are located less than the circular cutouts 3c and 3f. In other words, a larger area is provided for the layout of the wires. Therefore, the length of the bending portion 3 is reduced, so that the areas of the element-mounting portions (flat portions) are increased.

(Embodiment 8)

Figure 11:
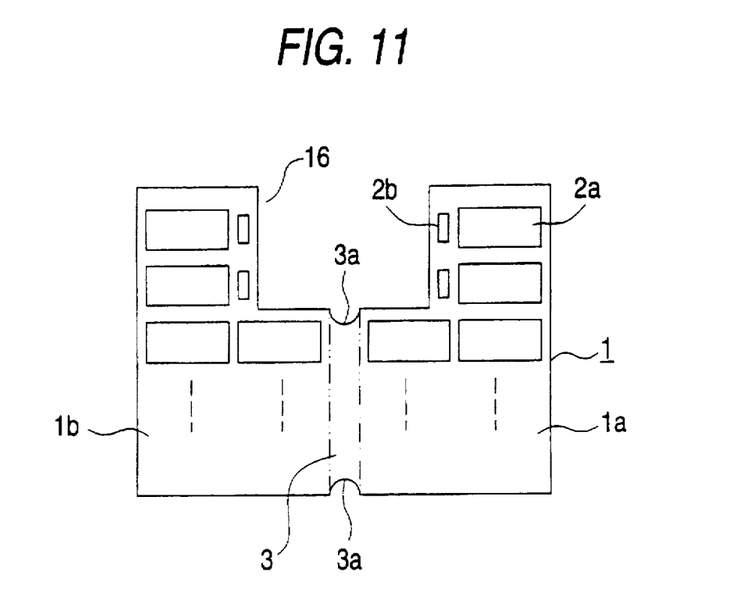
FIG. 11 is a plan view showing a printed circuit board according to the Embodiment 8 of the present invention.

FIG. 11 is a plan view showing a printed circuit board according to the Embodiment 8 of the present invention. In the Embodiment 8, the central part of the upper portion of the printed circuit board 1 is cut out to form a battery receiving portion 16. The printed circuit board 1 is folded along the bending portion 3 in a state that elements are mounted on the flat portions 1a and 1b. A battery is set in the space defined by the battery receiving portion 16. In the printed circuit board 1, the battery space is formed on both sides of the upper portion of the printed circuit board 1. In this embodiment, it is formed in the central part of the upper portion of the printed circuit board 1, closer to the bending portion 3. Accordingly, the areas of the element-mounting portions (flat portions) are increased over the conventional printed circuit board.

(Embodiment 9)

While the present invention has been described using the printed circuit board for a memory card, it is evident that the invention is applicable to any other printed circuit board of the type in which the board is folded into a compact form and placed in a limited space. The number of the flat portions is not limited to two. Three or more flat portions, and two or more bending portions may be present. The flat portion may also take a suitable shape.

In the above-mentioned embodiments, wires are used for the electrical connections between the flat portions. The electrical connections may be realized by an electromagnetic means, e.g., a weak electromagnetic wave. The wires may also be used in a time-division manner.

If so done, the length of the bending portion 3 may be reduced, leading to an increase in the areas of the flat portions so the area of the printed circuit board 1 is more efficiently used for the element mounting.

As seen from the foregoing description, in the present invention, a narrow cutout or cutouts are formed in the bending portion which is inevitably curved, and hence inappropriate for the mounting of ICs and chip elements thereon for, reliable soldering and for avoiding damage of the elements. With the provision of the cutout or cutouts, the board surface having elements thereon is kept horizontal while the board is placed in the card case. Further, the areas of the element-mounting portions (flat portions) for mounting the elements, ICs and chip elements, are increased.

As seen from the foregoing description, the present invention provides a printed circuit board having a bending portion and flat portions on which elements are mounted, characterized in that an elongated cutout is formed in the bending portion, whereby the areas of the flat portions are increased. Therefore, an increased area on the printed circuit board may be used for the mounting of the elements.

Further, the invention provides a printed circuit board of the type in which elements are mounted on the flat portions and the printed circuit board is bent, characterized in that an elongated cutout is formed in a bending portion, to thereby flatten part of the bending portion, and hence to increase the areas of the flat portions. Therefore, an increased area on the printed circuit board may be used for the mounting of the elements.

The invention also provides a printed circuit board having a bending portion bent when the printed circuit board is bendable, and flat portions on which elements are mounted, characterized in that an elongated cutout is formed in the bending portion, extending along the side of one of the mounted elements, facing the bending portion, whereby the areas of the flat portions are increased. Therefore, an increased number of elements may be mounted on the element-mounting flat portions of the printed circuit board.

In the printed circuit board, cutouts are formed at both ends of the bending portion. A further increase of the area of the flat portions is secured.

In the printed circuit board, an enlarged cutout serving as a strain-transfer/cut-extension stopping means is formed at the top end of the elongated cutout. The cut of the cutout does not extend to the bending portion, and a bending strain generated when the printed circuit board is bent along the bending portion is not transferred to the flat portions.

Additionally, the invention provides a printed circuit board having a bending portion bent when the printed circuit board is bent, and flat portions, characterized in that a cutout is formed in a portion of the printed circuit board which includes the bending portion, and a battery is placed in a space defined by the cutout when elements are mounted on the flat portions, and in this state, the printed circuit board is folded. The printed circuit board thus constructed also increases the area of the element-mounting flat portions of the printed circuit board.

What is claimed is:

1. A printed circuit board comprising:

first and second flat portions, each flat portion including first and second sides for mounting a plurality of elements; and a bending portion joining the first and second flat portions and bending to place the first and second flat portions in a superposed state wherein the first side of the first flat portion faces the first side of the second flat portion, the bending portion having a first width and including:

a first cutout including an elongate portion having a second width narrower than the first width, and an end portion having a third width substantially equal to the first width, a first end, and an opposing second end.

2. The printed circuit board of claim 1, wherein the end portion of the first cutout is located at the first end of the bending portion.

3. The printed circuit board of claim 1, wherein the bending portion includes a second cutout including an elongate portion having the second width and an end portion having the third width and wherein the end portion of the first cutout is located at the first end of the bending portion and the end portion of the second cutout is located at the second end of the bending portion.

4. The printed circuit board of claim 3, wherein the end portions of the first and second cutouts are circular.

5. The printed circuit board of claim 3, wherein the end portions of the first and second cutouts are semi-circular.

6. The printed circuit board of claim 3, wherein the end portions of the first and second cutouts are slits.

7. A printed circuit board comprising:

first and second flat portions, each flat portion including first and second sides for mounting a plurality of elements;

a bending portion joining the first and second flat portions and bending to place the first and second flat portions in a superposed state wherein the first side of the first flat portion faces the first side of the second flat portion, the bending portion having a first width and including:

a first cutout including an elongate portion having a second width narrower than the first width, and an end portion having a third width substantially equal to the first width, a first end, and an opposing second end, and first and second extending portions, each extending portion forming a substantially flat surface adjacent to the elongate portion when the first and second flat portions are in the superposed state, wherein a first element of the plurality of elements is mounted on the first extending portion.

8. The printed circuit board of claim 7, wherein the end portion of the first cutout is located at the first end of the bending portion.

9. The printed circuit board of claim 7, wherein the bending portion includes a second cutout including an elongate portion having the second width and an end portion having the third width and wherein the end portion of the first cutout is located at the first end of the bending portion and the end portion of the second cutout is located at the second end of the bending portion.

10. The printed circuit board of claim 9, wherein the end portions of the first and second cutouts are circular.

11. The printed circuit board of claim 9, wherein the end portions of the first and second cutouts are semi-circular.

12. The printed circuit board of claim 9, wherein the end portions of the first and second cutouts are slits.

13. A printed circuit board comprising:

first and second flat portions, each flat portion including first and second sides for mounting a plurality of elements;

a bending portion joining the flat portions and bending to place the first and second flat portions in a superposed state wherein the first side of the first flat portion faces the first side of the second flat portion, the bending portion having a first width and including:

a first cutout including a first portion having a second width wider than the first width and an end portion having a third width substantially equal to the first width, a first end, and an opposing second end, wherein the first portion of the first cutout defines a battery receiving portion when the first and second flat portions are in the superposed state.

14. The printed circuit board of claim 13, wherein the bending portion includes a second cutout having an elongate portion having a fourth width narrower than the first width and an end portion having the third width and wherein the first portion of the first cutout is located at the first end of the bending portion and the end portion of the second cutout is located at the second end of the bending portion.

15. The printed circuit board of claim 14, wherein the end portions of the first and second cutouts are circular.

16. The printed circuit board of claim 14, wherein the end portions of the first and second cutouts are semi-circular.

17. The printed circuit board of claim 14, wherein the end portions of the first and second cutouts are slits.

* * * * *